United States Patent
Takada et al.

[11] Patent Number: 6,153,824
[45] Date of Patent: Nov. 28, 2000

[54] PHOTO-SEMICONDUCTIVE ELECTRODE AND PHOTO-ELECTIC CELL USING THE SAME

[75] Inventors: Hokuto Takada; Hidekazu Hirose; Yoshiyuki Ono; Akira Imai; Katsuhiro Sato, all of Minami-Ashigara, Japan

[73] Assignee: Fuji Xerox Co., Ltd., Tokyo, Japan

[21] Appl. No.: 09/227,814

[22] Filed: Jan. 11, 1999

[30] Foreign Application Priority Data

Jan. 13, 1998 [JP] Japan ................................. 10-005037
Jul. 14, 1998 [JP] Japan ................................. 10-199079

[51] Int. Cl.[7] ........................ H01L 31/0224; C25B 11/06
[52] U.S. Cl. ........................ 136/263; 136/252; 204/280
[58] Field of Search ................................. 136/263, 256, 136/252; 204/280, 400, 403

[56] References Cited

U.S. PATENT DOCUMENTS

| | | | |
|---|---|---|---|
| 3,935,031 | 1/1976 | Adler | 136/206 |
| 4,125,414 | 11/1978 | Tang et al. | 136/89 |
| 4,175,981 | 11/1979 | Loutfy et al. | 136/89 |
| 4,175,982 | 11/1979 | Loutfy et al. | 136/89 |
| 4,385,102 | 5/1983 | Fitzgy et al. | 429/111 |
| 4,992,109 | 2/1991 | Yoshikawa et al. | 136/263 |
| 5,009,958 | 4/1991 | Yamashita et al. | 428/411.1 |

*Primary Examiner*—Ellis Robinson
*Assistant Examiner*—Michael C. Miggins
*Attorney, Agent, or Firm*—Oliff & Berridge, PLC

[57] ABSTRACT

Disclosed are a photo-semiconductive electrode that has a high light-to-electricity conversion efficiency and excellent stability and can be prepared economically and easily, and a photo-electric cell using the photo-semiconductive electrode. The photo-electric cell comprises a photo-semiconductive electrode having an electroconductive base and a light-to-electricity conversion layer formed thereon, and a counter electrode, such that the photo-semiconductive electrode and the counter electrode contact an electrolyte, wherein the light-to-electricity conversion layer holds an organic pigment. In the photo-electric cell, the photo-semiconductive electrode and the counter electrode are used integrally and disposed so that these electrodes contact the electrolyte. The organic pigment suited for use in the layer is selected from the group consisting of: phthalocyanine pigment such as titanyl phthalocyanine, chlorogallium phthalocyanine and hydroxygallium phthalocyanine; and naphthalocyanine pigments.

10 Claims, 2 Drawing Sheets

PHOTO-SEMICONDUCTIVE ELECTRODE AND PHOTO-ELECTIC CELL USING THE SAME

BACKGROUND OF THE INVENTION

1. Field of the Invention

The present invention relates to a photo-semiconductive electrode and to a photo-electric cell using the photo-semiconductive electrode. More specifically, the present invention relates to a wet-type photo-electric cell in which the photo-semiconductive electrode and a counter electrode contact an electrolyte, and also to the photo-semiconductive electrode which is used in this photo-electric cell.

2. Description of the Related Art

Recently, research has been actively pursued on energy utilizing solar energy, which is advantageous to the environment, as an energy source. Particularly, as a result of intensive studies of an element which directly converts solar energy into electric energy by using an inorganic semiconductor such as a silicon semiconductor or a gallium arsenide semiconductor, photo-electric cells, using a single crystal, a polycrystal or an amorphous thin film have been put to practical use. However, problems associated with these photo-electric cells are as follows. The production of these photo-electric cells that use inorganic semiconductors requires very high-level technology and large amounts of energy. These photo-electric cells cannot be described as an energy source that is advantageous to the environment because a toxic gas is used as a raw material for the production of the photo-electric cells. Further, in terms of cost, processes required to produce these photo-electric cells, including, for example, purification of raw materials, preparation of single crystals, high-speed slicing of crystals by means of multi-wire, preparation of amorphous thin films, and doping, lead to low productivity and high production costs. In addition, applications of these photo-electric cells are limited because it is difficult to set photo-electric cells using a crystalline system to a curved area having a small radius of curvature and because it is difficult to arrange these photo-electric cells in a rational manner for the purpose of increasing the light-receiving area, for example.

In order to overcome the above-mentioned problems of the photo-electric cells using inorganic semiconductors, intensive studies are being carried out on elements which exhibit photoelectromotive force using an organic semiconducting material, characterized by advantages such as diversity, low toxicity and ease of workability. For an element that exhibits photoelectromotive force to produce a photocurrent, the presence of an internal electric field is required. Several methods which produce the internal electric field in an element using an organic material are known.

1) Schottky Junction or MIS Junction

In this construction, an internal electric field produced by a metal/semiconductor junction is utilized. As the organic semiconductive material, those which utilize a merocyanine dye or a phthalocyanine pigment, have been reported (A. K. Ghosh et al., J. Appl. Phys. 49, p.5982, 1978). Problems associated with this constructionare as follows. Although these elements can produce a large open-circuit voltage, transmissivity to light of the electrode is reduced since a metallic material is used as an electrode. Further, since the oxidation resistance thereof is insufficient, the stability is insufficient and therefore the light-to-electricity conversion efficiency is undesirably reduced.

2) Heterogeneous p-n Junction Utilizing an n-type Organic Semiconductor/p-type Organic Semiconductor Junction As the n-type organic semiconducting material, an electron-donating organic material exemplified by dyes such as Malachite Green dye or Methyl Violet dye, or by a perylene pigment is utilized, and as the p-type organic semiconducting material, that which utilizes an electron-accepting material exemplified by a merocyanine dye or a phthalocyanine pigment have been reported (C. W. Tang et al., Appl. Phys. Lett. 48, p.183, 1986). Problems associated with this construction are as follows. Since constructions of these elements are complicated, pinholes tend to occur when films are formed. As a result, characteristics such as photocurrent, open-circuit voltage and stability are inadequate. Further, in a case where thin films are formed by a deposition process, production costs are undesirably high because, several manufacturing processes are required such as the formation of amorphous thin films for photo-electric cells using inorganic semiconductors.

SUMMARY OF THE INVENTION

Accordingly, a first object of the present invention is to provide a photo-semiconductive electrode that is made of an organic semiconducting material, is superior in such characteristics as light-to-electricity conversion efficiency and stability, and is able to be produced more economically and easily in comparison with conventional electrodes.

A second object of the present invention is to provide a photo-electric cell using the photo-semiconductive electrode having the above-mentioned characteristics.

As a result of studies to realize these objects, the present inventors have found that it is possible to produce a highly efficient photo-semiconductive electrode in a more economical and easy way by utilizing a photo-semiconductive electrode having a construction characterized in that a photo-semiconductive layer (light-to-electricity conversion layer) holds an organic pigment, in a photo-electric cell comprising the photo-semiconductive electrode and a counter electrode opposing this photo-semiconductive electrode such that these electrodes contact an electrolyte. Further, they have found that the light-to-electricity conversion efficiency of the photo-electric cell thus obtained is remarkably increased in comparison to conventional photo-electric cells. Further, they have achieved the invention of an organic wet-type photo-electric cell that can be structured as a flexible photo-electric-cell.

Namely, the photo-semiconductive electrode of the present invention is a photo-semiconductive electrode for a wet-type photo-electric cell in which the photo-semiconductive electrode and the counter electrode contact the electrolyte, wherein the construction of the photo-semiconductive electrode is characterized in that the photo-semiconductive layer (light-to-electricity conversion layer) thereof holds the organic pigment. The photo-electric cell of the present invention is a photo-electric cell in which the photo-semiconductive electrode and the counter electrode contact the electrolyte, wherein the photo-semiconductive layer (light-to-electricity conversion layer) is comprised of a layer that holds the organic pigment. In the photo-electric cell, at least one electrode can transmit light so that light may be taken into the photo-electric cell. Each of the electrodes may be used by itself and may have a substrate or a protective layer provided therewith.

DETAILED DESCRIPTION OF THE PREFERRED EMBODIMENTS

Details of the present invention are described below. An electrode of an electroconductive base for use in the present invention is preferably a substance capable of making an ohmic contact with an organic pigment and of transmitting light in a broad wavelength range within the visible light range. Examples of the substance for the electrode include indium-tin oxide (ITO), tinoxide (NESA), indiumoxide, zincoxide, copper, chromium, and gold.

Examples of the substrates that can be utilized in the electroconductive base include: standard glass such as quartz glass, soda-lime glass, and potash-lime glass; transparent glass substrates such as BK7 and lead glass; and transparent high polymer film substrates such as polyimide films, polyethylene terephthalate films, polyethylene naphthalate films, polyester films, polyethylene films, polyvinyl butyrate films, polypropylene films, transparent nylon films, polytetrafluoroethylene films, and tetrafluoroethylene/hexafluoroethylene copolymer films.

Examples of the organic pigment for use in a photo-semiconductive layer (light-to-electricity conversion layer) include organic compounds such as phthalocyanine pigments, naphthalocyanine pigments, perylene pigments, azo pigments, xanthene cyanine pigments, squalylium pigments, and porphyrin pigments. Among these organic pigments, particularly preferred are: compounds represented by the following general formula (1); perylene pigments represented by the following general formulae (2)~(5); and azo pigments represented by the following general formula (6).

(1)

In formula (1), M is a metal or ametal derivative selected from a group consisting of Li, Be, Na, Mg, Al, Si, K, Ca, Sc, Ti, V, Cr, Hn, Fe, Co, Zn, Ga, Ge, AS, Y, Zr, Nb, Mo, Tc, Ru, Rh, Pb, Ag, Cb, In, Sn, Sb, Ba, Hf, Ta, W, Os, Ir, Pt, Au, Hg, Tl, Pb, La, Ce, Pr, Nd, Pm, Sm, Eu, Gd, Tb, Dy, Ho, Er, Tm, Yb, Lu, Th, Pa, U, Np, and Am. $L_1$~$L_4$ are each independently selected from the group consisting of a benzene ring, a naphthalene ring, an anthracene ring, and a heterocyclic group having 1~20 carbon atoms. $X_1$~$X_4$ are each selected from the group consisting of a hydrogen atom, a halogen atom, an aromatic hydrocarbon group, an aliphatic hydrocarbon, and a heterocyclic group. k, m, n, and q are each an integer of from 0~8. When an aromatic hydrocarbon group is selected as $X_1$~$X_4$, the aromatic hydrocarbon group preferably has 6~12 carbon atoms. When an aliphatic hydro- carbon group is selected as $X_1$~$X_4$, the aliphatic hydrocarbon group preferably has 1~12 carbon atoms. When a heterocyclic group is selected as $X_1$~$X_4$, the heterocyclic group preferably has 1~12 carbon atoms. In the general formula (1), preferred examples of the metal derivative of M are TiO, GaCl, and GaOH. Among the compounds represented by the general formula (1), phthalocyanine pigments and naphthalocyanine pigments are preferable.

In the perylene pigments represented by the general formulae (2)~(5), A and A' are each a divalent aromatic hydrocarbon group or a divalent heterocyclic group including a nitrogen atom in a ring thereof. Preferably, A and A' are each represented, by any one of the following formulae (a1)~(a6) However, A and A' are not limited to the groups represented by these formulae. Further, A and A' may be the same or different.

(a1)

X is selected from the group consisting of an alkyl group, an alkoxy group, a halogen atom, and a nitro group; and n is 0, 1 or 2.

(a2)

(a3)

(a4)

(a5)

(a6)

B and B' are each selected from the group consisting of an alkyl group, a substituted or unsubstituted aryl group, and a substituted or unsubstituted aralkyl group. Preferably, B and B' are each represented by any one of the following formulae (b1)~(b3). However, B and B' are not limited to the groups represented by these formulae. Further, B and B' may be the same or different.

(b1)

(b2)

(b3)

In the formulae (b1) (b3), X is selected from the group consisting of an alkyl group, an alkoxy group, a halogen atom, and a nitro group; Y is —S— or —NH—; and n is 0, 1 or 2.

$$Cp-N=N-G-N=N-Cp' \quad (6)$$

In the azo pigments represented by the general formula (6), G is a divalent group whose carbon atom linked to the azo group is an $sp^2$-type carbon atom that forms a double bond. Preferably, G is represented by any one of the following formulae (g1)~(g9). However, G is not limited to the groups represented by these formulae. Further, Cp and Cp' may be the same or different.

(g1)

(g2)

(g3)

In the formula (g3), X is selected from the group consisting of a hydrogen atom, a halogen atom, an alkyl group, a cyano group, a nitro group, and a hydroxyl group; and n is 0, 1 or 2. Y is an oxygen atom or a dicyanomethylene group.

(g4)

(g5)

In the formula (g5), X is selected from the group consisting of a hydrogen atom, a halogen atom, a lower alkyl group, and a lower alkoxy group.

(g6)

In the formula (g6), $R_1$ is selected from the group consisting of a hydrogen atom, an alkyl group, a benzyl group, and an aryl group, which may be substituted.

(g7)

-continued (g8)

(g9)

In the formula (g9), $R_1$, $R_2$, $R_3$, and $R_4$ are each selected from the group consisting of a hydrogen atom, a halogen atom, an alkyl group, a benzyl group, and an alkoxy group, which may be substituted. $R_1$ and $R_2$ as well as $R_3$ and $R_4$ are both atomic groups required for joining together to form, together with the benzene ring, a naphthalene ring.

From the viewpoint of electric charge generating efficiency and light absorption, among the above-mentioned organic pigments, the following are preferable: titanyl phthalocyanine pigments having crystals in which the Bragg angles ($2^\theta \pm 0.2°$) have strong diffraction peaks at 9.3°, 10.6°, 13.2°, 15.1°, 15.7°, 16.1°, 20.8°, 23.3° and 26.6° or crystals in which the Bragg angles ($2^\theta \pm 0.2°$) have strong diffraction peaks at 9.7°, 11.7°, 15.0°, 23.5° and 27.3°, in X-ray diffraction spectra obtained by using $CuK^\alpha$ as a source of X-rays; chlorogalium phthalocyanine pigments having crystals in which the Bragg angles ($2^\theta \pm 0.2°$) have strong diffraction peaks at 7.4°, 16.6°, 25.5° and 28.3°, crystals in which the Bragg angles ($2^\theta \pm 0.2°$) have strong diffraction peaks at 6.8°, 17.3°, 23.6° and 26.9°, or crystals in which the Bragg angles ($2^\theta \pm 0.2°$) have strong diffraction peaks at 8.7~9.2°, 17.6°, 24.0°, 27.4° and 28.8°, in X-ray diffraction spectra obtained by using $CuK^\alpha$ as a source of X-rays; and hydroxygallium phthalocyanine pigments having crystals in which the Bragg angles ($2^\theta \pm 0.2°$) have strong diffraction peaks at 7.7°, 16.5°, 25.1° and 26.6°, crystals in which the Bragg angles ($2^\theta \pm 0.2°$) have strong diffraction peaks at 7.9°, 16.5°, 24.4° and 27.6°, or crystals in which the Bragg angles ($2^\theta \pm 0.2°$) have strong diffraction peaks at 7.0°, 7.5°, 10.5°, 11.7°, 12.7°, 17.3°, 18.1°, 24.5°, 26.2° and 27.1°, in X-ray diffraction spectra obtained by using $CuK^\alpha$ as a source of X-rays.

Some illustrative non-limiting examples of the methods for holding the organic pigments, such as phthalocyanine pigments, on an electroconductive base for use in the present invention are as follows. One method comprises dispersing an organic pigment in a binder resin and thereafter applying the resulting composition onto the electroconductive base by, for example, spin coating, dipping, spraying, blade coating, or air knife coating, to thereby form the light-to-electricity conversion layer. Another method comprises depositing the organic pigment itself on the electroconductive base by vacuum deposition, to thereby form the light-to-electricity conversion layer. Yet another method comprises dispersing the organic pigment in a solvent and thereafter applying the resulting dispersion onto the electroconductive base by, for example, spin coating, dipping, spraying, blade coating, or air knife coating, to thereby form a light-to-electricity conversion layer. Generally, the thickness of the light-to-electricity conversion layer is approximately from 0.01 to 1.0 µm, and preferably approximately from 0.03 to 0.2 µm. If the thickness is less than 0.01 µm a low level of light absorption, occurrence of pinholes, and reduction in the light-to-electricity conversion efficiency tend to occur. If the thickness is larger than 1.0 µm, since the internal resistance increases and the light-to-electricity conversion efficiency is reduced, it is unpreferable.

In a case where the light-to-electricity conversion layer is formed by dispersing the organic pigment in the binder resin, the binder resin to be used can be selected from a wide range of insulating resins.

As preferred resins, examples of electrically insulating resins include: polyvinyl acetal-based resins (such as polyvinyl butyral resins, polyvinyl formal resins, a partially acetalized polyvinyl butyral resin in which a portion of the butyral is modified with formal, acetoacetal or the like), polyarylate resins (such as a polycondensation product of bisphenol A and phthalic acid), polycarbonate resins, polyester resins, ether-modified polyester resins, phenoxy resins, polyvinyl chloride resins, polyvinylidene chloride resins, polyvinyl acetate resins, polystyrene resins, acrylic resins, methacrylic resins, polyacrylamide resins, polyamide resins, polyvinylpyridine resins, cellulosic resins, polyurethane resins, epoxy resins, silicone resins, polyvinyl alcohol resins, polyvinylpyrrolidone resins, casein, vinyl chloride/vinyl acetate-based copolymers (such as vinyl chloride/vinyl acetate copolymers, hydroxy-modified vinyl chloride/vinyl acetate copolymers, carboxy-modified vinyl chloride/vinyl acetate copolymers and vinyl chloride/vinyl acetate/maleic anhydride copolymers), styrene/butadiene copolymers, vinylidene chloride/acrylonitrile copolymers, styrene-modified alkyd resins, silicone-modified alkyd resins, and phenol/formaldehyde resins.

Further, the resins may be selected from organic photoconducting polymers such as polythiophene, polyaniline, poly-N-vinyl carbazole, polyvinylanthracene, and polyvinylpyrene. However, the binder resins are not limited to these insulating resins and organic photoconducting polymers. The binder resins may be used singly or in a combination of two or more.

The solvent as a dispersing medium needs to be selected while taking into account the dispersibility of the pigment in the solvent and the solvency of the solvent with respect to the binder resin. Specific examples of the solvent include: alcohols such as methanol, ethanol, n-propanol, i-propanol, n-butanol and benzylalcohol; ketones such as acetone, methyl ethyl ketone and cyclohexanone; amides such as dimethylformamide and dimethylacetamide; sulfoxides such as dimethyl sulfoxide; cyclic or straight-chain ethers such as tetrahydrofuran, dioxane, diethyl ether, methyl cellosolve and ethyl cellosolve; esters such as methyl acetate, ethyl acetate and n-butyl acetate; halogenated aliphatic hydrocarbons such as methylene chloride, chloroform, carbon tetrachloride, dichloroethylene and trichloroethylene; mineral oils such as ligroin; aromatic hydrocarbons such as benzene, toluene and xylene; and halogenated aromatic hydrocarbons such as chlorobenzene and dichlorobenzene. The solvents may be used singly or in a combination of two or more. The dispersion may be performed by using a ball mill, an attritor, a sand mill, or the like.

The blending ratio (by weight) of the organic pigment to the binder resin in the light-to-electricity conversion layer is in the range from 40:1 to 1:20, and preferably in the range from 10:1 to 1:10. If the blending ratio (by weight) of the organic pigment to the binder resin is less than 1/20, light absorption is reduced and the internal resistance increases, thus leading to a reduction in the light-to-electricity conversion efficiency. On the other hand, if the blending ratio (by weight) of the organic pigment to the binder resin is more than 40/1, the following tend to occur: difficulty in film formation, because the particles tend to cohere, and reduction in light-to-electricity conversion efficiency, because the light cannot reach the interface, which is formed between the light-to-electricity conversion layer and the electrolyte layer and which is the region where electric charge is generated.

As for the organic pigment to be dispersed in the binder resin, the light-to-electricity conversion efficiency becomes higher as the interface formed between the light-to-electricity conversion layer and the electrolyte layer becomes larger. From this viewpoint, it is desirable that the organic pigment be dispersed in the binder resin in the form of fine particles. If the particle diameter is too large, the internal resistance increases and, as a result, the light-to-electricity conversion efficiency is reduced. Therefore, the average particle diameter of the organic pigment is preferably 10 $\mu$m or less. Further, if the organic pigment is any one of the above-mentioned phthalocyanine pigments having the diffraction peaks, it is desirable that the organic pigment be dispersed in the form of particles of a crystal size from the viewpoint of better electric charge generation efficiency and better light absorption.

In the present invention, it is possible to sensitize the electron-donating organic pigment by using an electron-accepting binder resin. For the purpose of imparting an electron-accepting property to the binder resin, one method comprises incorporating electron-accepting molecules into the binder resin and another method comprises using a binder resin having an electron-accepting property itself. Some illustrative non-limiting examples of the electron-accepting molecule include quinone-based compounds such as p-benzoquinone, chloranil, bromoanil and anthraquinone; tetracyanoquinodimethane-based compounds; fluorene-based compounds such as 2,4,7-trinitrofluorenone; xanthone-based compounds; benzophenone-based compounds; cyanovinyl-based compounds; and ethylene-based compounds.

The mechanism of the sensitization caused by using the electron-accepting binder is believed to be as follows. That is, electron interactionbetween the electron-accepting binder and the electron-donating particles capable of producing optically generated carriers accelerates dissociation of the carriers and inhibits recombination of the carriers. As a result, the interaction exercises a beneficial effect on the formation of free carriers. If an electron-accepting organic pigment is used, it can be sensitized by an electron-donating binder or by electron-donating molecules.

The electrolyte, which contacts the photo-semiconductive electrode, and the counter electrode is desirably a substance which is a stable redox pair of ions capable of transporting electric charge between the electrodes at a sufficient speed. While redox pairs such as $I^-/I_3^-$, $Br^-/Br_3^-$ and quinone/hydroquinone or the like can be used, the potential of the redox pair needs to be lower than the potential of the conduction band of the organic semiconductor. Preferably, the cation is selected from cations that make the electrolyte easily soluble in the solvent.

The solvent for the electrolyte is preferably a solvent that is electrochemically inert and is capable of dissolving a sufficient amount of the electrolyte, but is incapable of dissolving the substance in the organic semiconductor layer. Examples of the solvent include acetonitrile, propylene carbonate, and water. When these solvents are used in the present invention, these solvents are preferably purified before being used. For example, in the case of acetonitrile, an exemplary purification process comprises the steps of removing water from the acetonitrile by means of a molecular sieve, adding 300 ml of methanol to 3000 ml of the resulting acetonitrile, distilling off the methanol, adding 1 g of NaOH, which has been suspended in paraffin oil in advance, to the solvent remaining as the residue of the distillation, distilling the solvent thus obtained so that the distillate passes through a column packed with alumina, adding 5 g of $CaH_2$ to the distillate thus collected, and further distilling the resulting liquid. Alternatively, a polymeric solid electrolyte having ionic conductivity may be used in place of the solvent.

The material constituting the counter electrode for use in the present invention is desirably a material that allows the oxidation of a substance in a reduced state, such as $I^-$, to proceed at a sufficient speed. For example, platinum, gold, silver, tin, indium, aluminum, ruthenium oxide, or nickel may be used. Alternatively, the counter electrode may be an electrode in which any one of the foregoing materials is supported on an electroconductive material. As in the case of the substrate of the electroconductive base, examples of material suited for use as the substrate in the counter electrode include: standard glass such as quartz glass, soda-lime glass and potash-lime glass; transparent glass substrates such as BK7 and lead glass; and transparent high polymer film substrates such as polyimide films, polyethylene terephthalate films, polyethylene naphthalate films, polyester films, polyethylene films, polyvinyl butyrate films, polypropylene films, transparent nylon films, polytetrafluoroethylene films, and tetrafluoroethylene/hexafluoroethylene copolymer films. At the time when a photo-electric cell is finally prepared, an electrolyte solution containing a redox pair is placed in a gap between the organic semiconducting electrode and the counter electrode, which are separated from each other by means of a spacer placed therebetween. Thereafter, the gap is sealed with a sealant. Examples of the spacer include insulating sheets, or insulating particles made of such material as Teflon, glass or polystyrene. Although a short distance between the electrodes is desirable, too short a distance increases the risk of short-circuiting. Therefore, a preferred distance is in the range from 10 to 100 $\mu$m. As for the sealant, a material insoluble in the solvent of the electrolyte is desirable. Accordingly, examples of the material for use as the sealant include epoxy resins and silicone resins.

Figure 1:
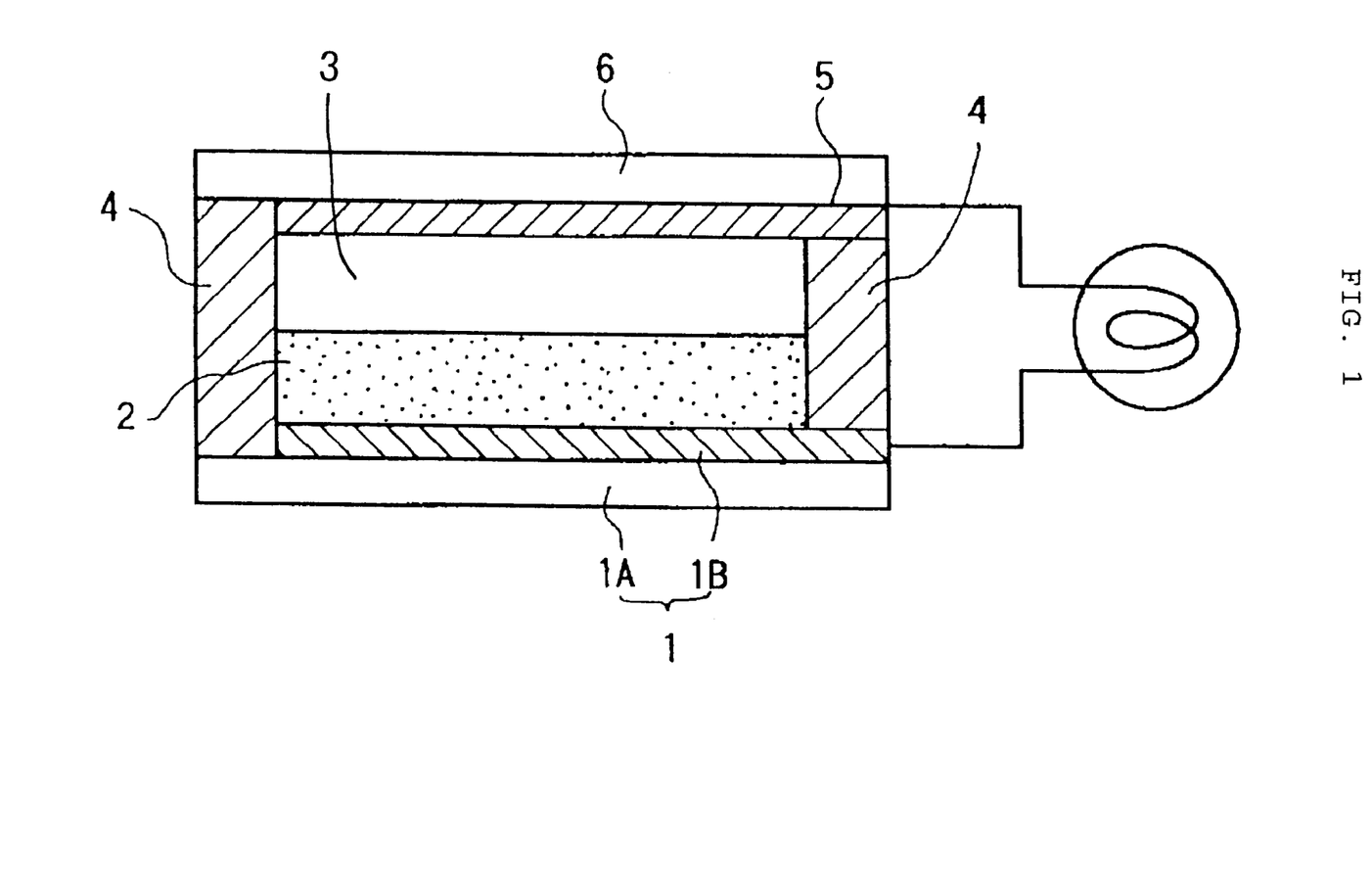
FIG. 1 is a schematic sectional view of a preferred embodiment of the photo-electric cell of the present invention.

FIG. 1 is a schematic sectional view of thephoto-electric cell according to the present invention which uses the light-to-electricity conversion layer comprising an organic pigment dispersed in a binder resin. In FIG. 1, 1 designates the electroconductive base (substrate 1A and electrode 1B); 2 designates a layer (light-to-electricity conversion layer) comprising an electron-donating organic pigment dispersed in a binder resin in a state in which particles of crystal size are dispersed; 3 designates the electrolyte layer; 4 designates the spacer; 5 designates the counter electrode; and 6 designates the substrate of the counter electrode.

The generation of a photoelectromotive force by the construction of the element of the present invention is based on an internal electric field which is present in the vicinity of the semiconducting layer side of the interface and which is created in the interface between the semiconducting layer (light-to-electricity conversion layer) and the electrolyte layer by the difference between the Fermi energy of the former and the redox potential of the latter. In this internal electric field portion, light absorption generates excitons which are then separated into electrons and holes by the internal electric field, so and which are ultimately carried outside as an electric current. Consequently, the light-to-electricity conversion efficiency is governed mainly by, for example: the amount of light to be absorbed in the region; the carrier generating capacity, which depends on the size of the internal electric field, which in turn is determined principally by the relationship between the electron-donating organic substance and the state of the electrons of the substance in a reduced state; the mobility of the electrons and holes in each of the layers; and the injectability of the electrons and holes into the electrodes.

The light-to-electricity conversion efficiency ($\eta$) is represented by the following equation (1):

$$\eta(\%)=(Voc \times Jsc \times ff) \times 100/Pin \tag{1}$$

wherein Voc is the open-circuit voltage, Jsc is the short-circuit photocurrent density, and ff is the coefficient of a curve indicating the voltage-current characteristics when the element is irradiated with light. The value of ff ranges from 0 to 1, wherein the light-to-electricity conversion efficiency becomes higher as the value of ff approaches 1. Pin is the energy of incident light. The value of ff varies greatly depending on the reverse current, i.e., leakage, at the interface between the electron-donating organic substance layer and the electrolyte layer, and on the internal resistance of the element, mainly due to, the mobility of electrons/holes or ions in each of the layers or the injectability thereof into the electrodes, such that the value of ff approaches 1 as the former becomes smaller or as the latter becomes smaller. The term "internal resistance" indicates the resistance in which the direction of the photocurrent flows when the element is irradiated with light.

The most important indicator indicating the performance of a solar cell is the light-to-electricity conversion efficiency. However, even the same solar cell exhibits different values of the efficiency depending on, for example, the spectra or intensities of the light that is radiated.

According to the equation (1), since the light-to-electricity conversion efficiency ($\eta$) becomes larger if Voc (open-circuit voltage), Jsc (short-circuit photocurrent density), and ff (coefficient of the curve indicating the voltage-current characteristics when the element is irradiated with light) increase, an increase in these values results in the performance, which depends on the light-to-electricity conversion efficiency ($\eta$), improving.

Because of the construction of the photo-semiconductive electrode in which the organic pigment is held, the present invention provides the following advantages. That is, in the manufacturing process of the photo-semiconductive electrode of the present invention, a complicated process like the manufacturing process of a photo-electric cell in which an inorganic semiconductor is utilized is not necessary and a uniform light-to-electricity conversion layer can be produced easily. In the photo-electric cell of the present invention, the amount of short-circuit currents can be reduced to a lower value in comparison to that of a conventional photo-electric cell using an organic substance. Further, since the adhesion between the light-to-electricity conversion layer and the substrate is good such that peeling or breakage does not occur, the light-to-electricity conversion efficiency and the stability are improved.

EXAMPLES

The following examples illustrate the present invention in further detail. However, these examples are not to be construed to limit the scope of the present invention. The measurements of the light-to-electricity conversion characteristics of the prepared photo-electric cells were made by the following procedure. A xenon lamp (manufactured by ORIEL Corp.) was used as a source of radiation. The light beam was separated into component rays to obtain a desired monochromatic light having a wavelength within the range from 400 to 950 nm by using a spectroscope (manufactured by Koken Kogyo Co., Ltd.) The element was then irradiated with light having the desired wavelength from the photo-semiconductive electrode side, while keeping the intensity of light at a constant value within the range from 10 to 1000 $\mu W/cm^2$ by using a device for radiating light of a constant intensity (manufactured by Optel Corp.), and the current flowing in the element when a constant voltage was applied between the electrodes was measured by using a Source Measure Unit (manufactured by KEITHLEY Corp.).

In the experiments, the voltage-current characteristics of the solar cells were measured when the solar cells were irradiated with light. The light for irradiation was a monochromatic light having a wavelength of 800 nm and an intensity of 25 $\mu W/cm^2$, and the voltage was within the range from −0.2 to 0.6 V.

From the voltage-current characteristic curve thus obtained, Voc (open-circuit voltage), Jsc (short-circuit photocurrent density), and ff (coefficient of the curve indicating the voltage-current characteristics when the element was irradiated with light) were obtained. That is, in the voltage-current characteristic curve, the point where the curve intersects the axis of voltage, namely the voltage at I=0, denotes the open-circuit voltage Voc. On the other hand, the point where the curve intersects the axis of current, namely the current at V=0, denotes short-circuit photocurrent I sc. The Jsc (short-circuit photocurrent density) was calculated by dividing the value of I sc by the area of the element. Further, ff (coefficient of the curve indicating the voltage-current characteristics when the element is irradiated with light) corresponds to a value obtained by dividing the maximum output power (maximum value of I×V) of the element by I sc×Voc.

Accordingly, the light-to-electricity conversion efficiency ($\eta$) was obtained in accordance with the equation (1) by using Voc, Jsc, ff, and Pin (intensity of the radiated light).

Example 1

Figure 2:
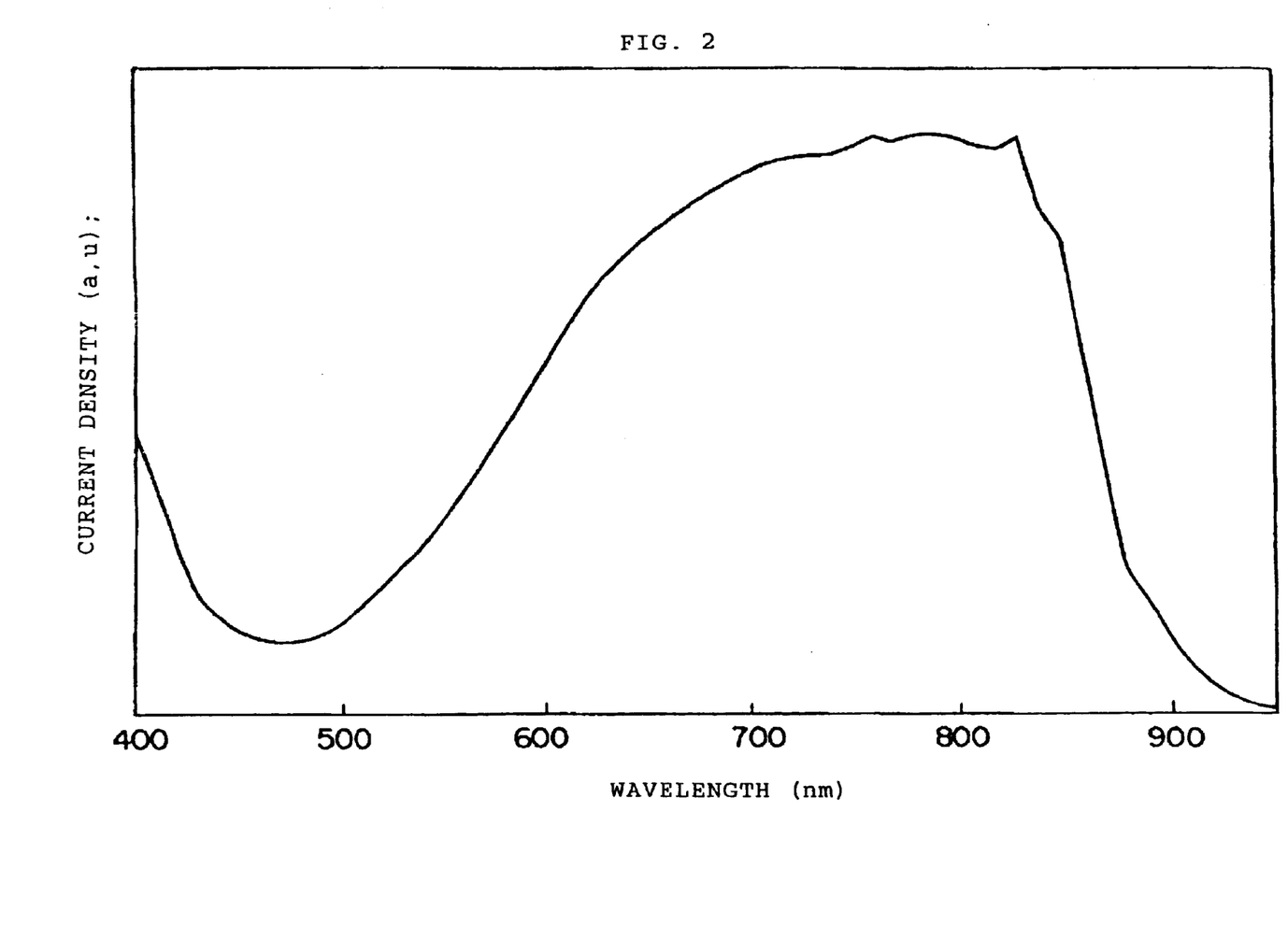
FIG. 2 is a graph illustrating how the wavelength of the photocurrent depends on the time during which light was irradiated, with respect to the photo-electric cell of a first embodiment.

A glass substrate having a 10 mm×10 mm square ITO electrode formed thereon was cleaned according to the following procedure. The substrate was subjected to ultrasonic cleaning in acetone (manufactured by Wako Pure Chemical Industries, Ltd., guaranteed reagent grade) for 5 minutes, and then to ultrasonic cleaning in methylene chloride (manufactured by Wako Pure Chemical Industries, Ltd., guaranteed reagent grade) for 5 minutes. Further, the substrate was subjected to ultrasonic cleaning in an alkaline cleaning solution comprising 95 parts by volume of a 1.1 percent by weight sodium hydroxide aqueous solution and 5 parts by volume of NCW-601 A Cleaner (manufactured by Wako Pure Chemical Industries, Ltd.) for 10 minutes, and thereafter was rinsed with pure water. Thereafter, the substrate was subjected to ultrasonic cleaning in acetone (manufactured by Kanto Kagaku Co., Ltd., EL grade) for 5 minutes, ultrasonic cleaning in isopropyl alcohol (manufactured by Kanto Kagaku Co., Ltd., EL grade) for 5 minutes, and then ultrasonic cleaning in ethanol (manufactured by Kanto Kagaku Co., Ltd., EL grade) for 5 minutes. After these cleaning steps, the substrate was sufficiently dried in a nitrogen gas atmosphere. 3 parts by weight of titanyl phthalocyanine as an electron-donating organic pigment, 3 parts by weight of VMCH (carboxy-modified vinyl chloride/vinyl acetate copolymer) as a binder resin, and 100 parts by weight of butyl acetate as a solvent were placed in a glass vessel. Further, glass beads having a diameter of 1 mm were placed in the vessel. The vessel was then shaken for 2 hours by means of a paint shaker (manufactured by Asada Steel Works Co., Ltd.) to carry out dispersion. In this way, a slurry was prepared. Using a spin coater (manufactured by Kyowa Riken Co.), this slurry was coated on a glass substrate having an ITO electrode formed thereon and cleaned according to the above-described procedure, to thereby form a light-to-electricity conversion layer. After layer formation, the substrate having this construction thereon was sufficiently dried. In this way, a photo-semiconductive electrode was prepared. Meanwhile, a platinum thin film having a thickness of 360 nm was formed by using a sputtering apparatus (manufacturedbyHitachi Ltd.) on another glass substrate having an ITO electrode formed thereon and cleaned according to the above-described procedure, to thereby prepare a counter electrode. A combination of lithium iodide (manufactured by Wako Pure Chemical Industries, Ltd., 0.25 M) and iodine (manufacturedbyWako Pure Chemical Industries, Ltd., 0.025 M) was used as a solute for the electrolyte solution, while acetonitrile, which had been purified by distillation, was used as a solvent. A photo-electric cell was prepared by using the photo-semiconductive electrode, the platinum thin film electrode (counter electrode) and the electrolyte solution. As shown in FIG. 1, the element had a construction in which the electrolyte solution and both ends of the spacer were sandwiched between the photo-semiconductive electrode and the counter electrode (platinum thin film electrode). A Teflon sheet having a thickness of 100 $\mu$m was used as the spacer. The effective area of the element was 1.0 cm$^2$. The wavelength dependence of the photocurrent generated when the element was irradiated with light is shown in FIG. 2. The light-to-electricity conversion characteristics, which were obtained by irradiating the element with light having a wavelength of 800 nm and an intensity of 25 $\mu$W/cm$^2$, are given in Table 1.

Example 2

3 parts by weight of titanyl phthalocyanine as an electron-donating organic pigment, 3 parts by weight of VMCH (carboxy-modified vinyl chloride/vinyl acetate copolymer), 0.1 parts by weight of 2,4,7-trinitrofluorenone, and 100 parts by weight of butyl acetate as a solvent were placed in a glass vessel. Further, glass beads having a diameter of 1 mm were placed in the vessel. The vessel was then shaken for 2 hours by means of a paint shaker to carry out dispersion. In this way, a slurry was prepared. Using this slurry, a photo-electric cell was prepared as in Example 1. Under the same conditions as in Example 1, light-to-electricity conversion characteristics were obtained and the results are shown in Table 1.

Example 3

A photo-electric cell was prepared by repeating the procedure of Example 1, except that chlorogallium phthalocyanine was used as an electron-donating organic pigment. Under the same conditions as in Example 1, light-to-electricity conversion characteristics were obtained and the results are shown in Table 1.

Example 4

A photo-electric cell was prepared by repeating the procedure of Example 1, except that hydroxygallium phthalocyanine was used as an electron-donating organic pigment. Under the same conditions as in Example 1, light-to-electricity conversion characteristics were obtained and the results are shown in Table 1.

Example 5

A photo-electric cell was prepared by repeating the procedure of Example 1, except that the following alterations were made. In place of the glass substrate having an ITO electrode formed thereon as used in Example 1, use was made of a polyethylene terephthalate film having an ITO electrode formed thereon (T-COAT, manufactured by Teijin Ltd.). This substrate was subjected to ultrasonic cleaning in acetone for 5 minutes, ultrasonic cleaning in isopropyl alcohol for 5 minutes, and then to ultrasonic cleaning in ethanol for 5 minutes. After these cleaning steps, the substrate was sufficiently dried in a nitrogen gas atmosphere.

3 parts by weight of titanyl phthalocyanine as an electron-donating organic pigment, 3 parts by weight of VMCH (carboxy-modified vinyl chloride/vinyl acetate copolymer) as a binder resin, 0.1 parts by weight of 2,4,7-trinitrofluorenone, and 100 parts by weight of butyl acetate as a solvent were placed in a glass vessel. Further, glass beads having a diameter of 1 mm were placed in the vessel. The vessel was then shaken for 2 hours by means of a paint shaker to carry out dispersion. In this way, a slurry was prepared. Using a blade coaten this slurry was coated on one of the film substrates, which had been cleaned according to the above-described procedure, to thereby form a light-to-electricity conversion layer. After formation of the layer, the substrate having this construction thereon was sufficiently dried. In this way, a photo-semiconductive electrode was prepared. Meanwhile, a platinum thin film was formed by using a sputtering apparatus on another film substrate, which had been cleaned according to the above-described procedure, to thereby prepare a counter electrode. A dispersion comprising Micropearl SP-21 (manufactured by Sekisui Fine Chemical Co., Ltd.) dispersed in ethanol, was coated on the platinum thin film electrode to thereby form a coating which served as a spacer. After the injection of the electrolyte solution and sealing by means of a sealant, a photo-electric cell was prepared. Under the same conditions as in Example 1, light-to-electricity conversion characteristics were obtained and the results are shown in Table 1.

Example 6

A titanyl phthalocyanine thin film was formed by vacuum deposition on a glass substrate having an ITO electrode formed thereon and cleaned according to the above-described procedure, to thereby form a light-to-electricity conversion layer. In this way, a photo-semiconductive electrode was prepared. The thickness of the light-to-electricity conversion layer thus formed was 0.1 $\mu$m, and the degree of the vacuum for the formation of the thin film was 10$^{-5}$ Torr. By using this photo-semiconductive electrode, a photo-electric cell similar to the photo-electric cell of Example 1 was prepared. Under the same conditions as in Example 1, light-to-electricity conversion characteristics were obtained and the results are shown in Table 1.

Comparative Example 1

On a glass substrate having an ITO electrode formed thereon and cleaned according to the above-described procedure, there were succesively coated by vacuum deposition a perylene pigment having the following structural formula (2) and a nonmetallophthalocyanine pigment, in that order, to thereby prepare a light-to-electricity conversion layer. In this way, a photo-semiconductive electrode was prepared. The thickness of each of the films thus formed was 0.1 μm, and the degree of the vacuum for the formation of the films was $10^{-5}$ Torr. Next, gold was coated by vacuum deposition on the backside of the glass substrate to thereby form a backside electrode (counter electrode). According to the above-described procedure, a dry-type photo-electric cell, in which neither the photo-semiconductive electrode nor the counter electrode contacted an electrolyte, was prepared. The effective area of the element was 1.0 cm². Under the same conditions as in Example 1, light-to-electricity conversion characteristics were obtained and the results are shown in Table 1.

Structural Formula (2)

TABLE 1

|  | $J_{sc}$ (μA/cm²) | $V_{cc}$ (V) | ff | η (%) |
| --- | --- | --- | --- | --- |
| Example 1 | 5.41 | 0.375 | 0.36 | 2.92 |
| Example 2 | 6.24 | 0.378 | 0.39 | 3.68 |
| Example 3 | 5.26 | 0.366 | 0.34 | 2.62 |
| Example 4 | 5.14 | 0.370 | 0.35 | 2.66 |
| Example 5 | 5.05 | 0.362 | 0.35 | 2.56 |
| Example 6 | 5.47 | 0.335 | 0.23 | 1.69 |
| Comparative Example 1 | 4.10 | 0.363 | 0.21 | 1.25 |

As can be seen from Table 1, the light-to-electricity conversion efficiencies of the photo-electric cells of Examples 1~6, which used metallophthalocyanine pigments, are higher than the light-to-electricity conversion efficiency of the photo-electric cell in which a perylene pigment and a nonmetallophthalocyanine pigment are used and in which neither the photo-semiconductive electrode nor the counter electrode contacted an electrolyte. In Examples 1~5, the light-to-electricity conversion layer can be easily prepared, because the light-to-electricity conversion layer has a construction comprising the organic pigment dispersed in the binder resin. Further, in Example 5, a flexible photo-electric cell having good workability can be obtained by using a polyethylene terephthalate film as the substrate for the electroconductive base and the counter electrode.

Further, as is apparent from FIG. 2, the photo-electric cell using a metallophthalocyanine pigment exhibits photosensitivity in a wide range of wavelengths.

Since the light-to-electricity conversion layer of the photo-semiconductive electrode of the present invention has a layer construction in which the organic pigment is held, the photo-semiconductive electrode can be prepared in a simple and easy manner. The photo-electric cell using this photo-semiconductive electrode has a high light-to-electricity conversion efficiency and an improved stability. Further, since the photo-electric cell of the present invention can be formed as a flexible photo-electric cell, it can be used in a wide range of applications.

What is claimed is:

1. A photo-semiconductive electrode comprising an electroconductive base and a light-to-electricity conversion layer formed on the electroconductive base for use in combination with a counter electrode such that both of the photo-semiconductive electrode and the counter electrode contact an electrolyte, wherein the light-to-electricity conversion layer comprises an organic pigment dispersed in a binder resin.

2. A photo-semiconductive electrode according to claim 1, wherein the electroconductive base comprises a substrate having flexibility.

3. A photo-semiconductive electrode according to claim 1, wherein the organic pigment comprises a compound represented by the following general formula (1):

wherein $L_1$~$L_4$ are each independently selected from the group consisting of a benzene ring, a naphthalene ring, an anthracene ring, and a heterocyclic group having 1~20 carbon atoms; $X_1$~$X_4$ are each independently selected from the group consisting of a hydrogen atom, a halogen atom, an aromatic hydrocarbon group, an aliphatic hydrocarbon group, and a heterocyclic group; M is a metal or a metal derivative; and k, m, n, and q are each an integer of from 0~8.

4. A photo-semiconductive electrode according to claim 1, wherein M in the formula (1) is selected from among TiO, GaCl, and GaOH.

5. A photo-electric cell comprising:

a photo-semiconductive electrode comprising an electroconductive base and a light-to-electricity conversion layer formed on the electroconductive base, the light-to-electricity conversion layer comprising an organic pigment dispersed in a binder resin; and a counter electrode opposing the photo-semiconductive electrode;

wherein the photo-semiconductive electrode and the counter electrode are disposed so that both electrodes contact an electrolyte.

6. A photo-electric cell according to claim 5, wherein the electroconductive base and the counter electrode are each formed with a material having flexibility.

7. A photo-electric cell according to claim 5, wherein the organic pigment comprises a compound represented by the following general formula (1):

(1)

(1)

wherein $L_1$~$L_4$ are each independently selected from the group consisting of a benzene ring, a naphthalene ring, an anthracene ring, and a heterocyclic group having 1~20 carbon atoms; $X_1$~$X_4$ are each independently selected from the group consisting of a hydrogen atom, a halogen atom, an aromatic hydrocarbon group, an aliphatic hydrocarbon group, and a heterocyclic group; M is a metal or a metal derivative; and k, m, n, and q are each an integer of from 0~8.

8. A photo-electric cell according to claim 7, wherein M in the formula (1) is selected from among TiO, GaCl, and GaOH.

9. A photo-electric cell according to claim 6, wherein the organic pigment comprises a compound represented by the following general formula (1):

wherein $L_1$~$L_4$ are each independently selected from the group consisting of a benzene ring, a naphthalene ring, an anthracene ring, and a heterocyclic group having 1~20 carbon atoms; $X_1$~$X_4$ are each independently selected from the group consisting of a hydrogen atom, a halogen atom, an aromatic hydrocarbon group, an aliphatic hydrocarbon group, and a heterocyclic group; M is a metal or a metal derivative; and k, m, n, and q are each an integer of from 0~8.

10. A photo-electric cell according to claim 9, wherein M in the formula (1) is selected from among TiO, GaCl, and GaOH.

* * * * *

UNITED STATES PATENT AND TRADEMARK OFFICE
CERTIFICATE OF CORRECTION

PATENT NO. : 6,153,824
DATED : November 28, 2000
INVENTOR(S) : Hokuto Takada; Hidekazu Hirose; Yoshiyuki Ono; Akira Imai; and Katsuhiro Sato It is certified that error appears in the above-identified patent and that said Letters Patent is hereby corrected as shown below:

On the cover page, at "[54]" second line, change "PHOTO-ELECTIC" to

--PHOTO-ELECTRIC--; and immediately after "[56] References Cited" insert the following:

--OTHER PUBLICATIONS

A. GHOSH et al., "Merocyanine Organic Solar Cells", J. Appl. Phys., Vol. 49, No. 12, pp. 5982-5989 (1978).

C.W. TANG; "Two-Layer Organic Photovoltaic Cell", Appl. Phys. Lett., Vol. 48, No. 2, pp. 183-185 (1986).--

Signed and Sealed this

Eighth Day of May, 2001

*Attest:*

NICHOLAS P. GODICI

*Attesting Officer*  *Acting Director of the United States Patent and Trademark Office*